(12) United States Patent
Ishibashi et al.

(10) Patent No.: US 12,166,087 B2
(45) Date of Patent: Dec. 10, 2024

(54) SiC EPITAXIAL WAFER AND METHOD FOR MANUFACTURING SIC EPITAXIAL WAFER

(71) Applicant: SHOWA DENKO K.K., Tokyo (JP)

(72) Inventors: Naoto Ishibashi, Chichibu (JP); Keisuke Fukada, Chichibu (JP)

(73) Assignee: Resonac Corporation, Tokyo (JP)

( * ) Notice: Subject to any disclaimer, the term of this patent is extended or adjusted under 35 U.S.C. 154(b) by 177 days.

(21) Appl. No.: 17/454,416

(22) Filed: Nov. 10, 2021

(65) Prior Publication Data

US 2022/0149160 A1 May 12, 2022

(30) Foreign Application Priority Data

Nov. 12, 2020 (JP) .................. 2020-188693

(51) Int. Cl.
| | |
|---|---|
| *H01L 29/36* | (2006.01) |
| *C30B 25/14* | (2006.01) |
| *C30B 25/16* | (2006.01) |
| *C30B 29/36* | (2006.01) |
| *H01L 21/02* | (2006.01) |
| *H01L 29/16* | (2006.01) |

(52) U.S. Cl.
CPC ............ *H01L 29/365* (2013.01); *C30B 25/14* (2013.01); *C30B 25/165* (2013.01); *C30B 29/36* (2013.01); *H01L 21/02378* (2013.01); *H01L 21/02529* (2013.01); *H01L 21/02584* (2013.01); *H01L 21/0262* (2013.01); *H01L 29/1608* (2013.01)

(58) Field of Classification Search
None
See application file for complete search history.

(56) References Cited

U.S. PATENT DOCUMENTS

| | | | |
|---|---|---|---|
| 2017/0317173 A1* | 11/2017 | Uchida | H01L 29/1608 |
| 2018/0233354 A1* | 8/2018 | Masuda | H01L 21/0262 |
| 2019/0040545 A1 | 2/2019 | Nakamura et al. | |
| 2019/0316273 A1* | 10/2019 | Ishibashi | H01L 21/02579 |

FOREIGN PATENT DOCUMENTS

| | | |
|---|---|---|
| JP | 08-139048 A | 5/1996 |
| JP | 2006-237319 A | 9/2006 |
| JP | 2009-088223 A | 4/2009 |
| JP | 2012-020889 A | 2/2012 |
| JP | 2012020889 A * | 2/2012 |
| JP | 2015-002207 A | 1/2015 |
| JP | 2015-051895 A | 3/2015 |
| JP | 2018-046085 A | 3/2018 |

(Continued)

OTHER PUBLICATIONS

Machine Translation for JP2018046085 (Year: 2018).*

(Continued)

*Primary Examiner* — Michael Forrest
(74) *Attorney, Agent, or Firm* — Sughrue Mion, PLLC

(57) ABSTRACT

A SiC epitaxial wafer of the present invention includes a SiC single crystal substrate, and a high concentration layer that is provided on the SiC single crystal substrate and has an average value of an n-type doping concentration of $1 \times 10^{18}/\text{cm}^3$ or more and $1 \times 10^{19}/\text{cm}^3$ or less, and in-plane uniformity of the doping concentration of 30% or less.

21 Claims, 5 Drawing Sheets

(56) References Cited

FOREIGN PATENT DOCUMENTS

| JP | 6386706 B2 | 9/2018 |
| JP | 2019-165166 A | 9/2019 |
| KR | 10-2005-0015931 A | 2/2005 |
| WO | 2017/094764 A1 | 6/2017 |
| WO | 2018/211737 A1 | 11/2018 |

OTHER PUBLICATIONS

Japanese Office Action ("Notice of Reasons for Refusal") dated Mar. 22, 2022 for related Japanese Patent Application No. 2020-188693.
Japanese Office Action ("Notice of Reasons for Refusal") dated Aug. 30, 2022 for related Japanese Patent Application No. 2020-188693.
Decision to Grant a Patent dated Mar. 7, 2023 for related Japanese Patent Application No. 2020-188693.
Office Action dated Mar. 22, 2022 from the Japanese Patent Office in JP Application No. 2020-188693.
European Search Report dated Apr. 25, 2022 in European Application No. 21207716.8.

* cited by examiner

SiC EPITAXIAL WAFER AND METHOD FOR MANUFACTURING SiC EPITAXIAL WAFER

BACKGROUND OF THE INVENTION

Field of the Invention

The present invention relates to a SiC epitaxial wafer and a method for manufacturing the same.

Priority is claimed on Japanese Patent Application No. 2020-188693, filed Nov. 12, 2020, the content of which is incorporated herein by reference.

Description of Related Art

Silicon carbide (SiC) has a dielectric breakdown electric field that is one order of magnitude larger, a bandgap that is three times larger, and a thermal conductivity that is about three times higher than silicon (Si). For this reason, silicon carbide (SiC) is expected to be applied to power devices, high frequency devices, high temperature operation devices, and the like.

In order to promote the practical application of SiC devices, it is required to establish high-quality and low-cost SiC epitaxial wafers and epitaxial growth technology.

SiC devices are formed by using a SiC epitaxial wafer that includes a SiC substrate and an epitaxial layer formed on the SiC substrate. The SiC substrate is obtained by processing a bulk single crystal of SiC grown by a sublimation recrystallization method or the like. The epitaxial layer is formed by a chemical vapor deposition (CVD) method or the like and serves as a breakdown voltage maintaining region of a device.

More specifically, the epitaxial layer is formed on the SiC substrate with a plane having an off angle in the <11-20> direction from the (0001) plane serving as a growth plane. The epitaxial layer is formed by performing step-flow growth (lateral growth from an atomic step) on the SiC substrate to become 4H—SiC.

Basal plane dislocations (BPDs) are known as one type of device killer defect that causes fatal defects in a SiC device on a SiC epitaxial wafer. For example, when a current is passed through a bipolar device in the forward direction, partial dislocations of the BPDs inherited from the SiC substrate by the epitaxial layer move and expand (in other words, the BPDs extend and expand) due to recombination energy of flowing carriers, thereby forming high resistance stacking faults. In addition, when a high resistance portion is generated in the device, reliability of the device is lowered (forward deterioration). For that reason, reduction of the BPDs inherited by the epitaxial layer has been ongoing.

Further, most of the BPDs in the SiC substrate can be converted into threading edge dislocations (TEDs) in which expansion of defects does not occur when an epitaxial layer is formed (Patent Document 1).

However, it has become clear in recent years that, in a case in which a large current is applied in the forward direction, the BPDs converted into the TEDs at an interface between the SiC substrate and the epitaxial layer also expand to stacking faults (SFs) in the epitaxial layer. For that reason, in large-current power devices whose market is expected to expand in the future, simply converting the basal plane dislocations into the TEDs cannot sufficiently inhibit formation of the SFs, and there is always a concern of deterioration in reliability of the device.

Patent Document 2 discloses that, in addition to a normal epitaxial layer, an epitaxial layer having a higher impurity concentration is formed in a SiC epitaxial wafer, and thus conversion efficiency from BPDs to TEDs at an interface between a SiC single crystal substrate and the epitaxial layer can be improved. By increasing the conversion efficiency of the BPDs, elongation and expansion of the BPDs can be inhibited. The elongation and expansion of the BPDs are a cause of forward deterioration of a device. For that reason, formation of the epitaxial layer having a high impurity concentration is considered to be a promising solution for inhibiting forward deterioration of a SiC device using a SiC epitaxial wafer.

Patent Document 3 discloses a manufacturing method for improving in-plane uniformity in doping concentration of a low concentration layer. However, it does not mention in-plane uniformity in doping concentration of a high concentration layer.

PATENT DOCUMENTS

Patent Document 1: Japanese Unexamined Patent Application, First Publication No. 2009-88223
Patent Document 2: PCT International Publication No. WO2017/094764
Patent Document 3: Japanese Patent No. 6386706

SUMMARY OF THE INVENTION

The present inventors have found previously unknown problems in which, when a SiC epitaxial wafer, which includes a SiC single crystal substrate and a normal epitaxial layer, and further includes an n-type epitaxial layer having a high doping concentration (a high concentration layer) between them, is produced, in-plane uniformity (in the present specification, the in-plane uniformity of the doping concentration indicates an "absolute value of (the maximum value of the doping concentration−the minimum value of the doping concentration)/an average value of the doping concentration") of an n-type doping concentration of the n-type epitaxial layer having a high doping concentration (high concentration layer) deteriorates. In addition, as a result of diligent studies, the present invention for solving such a problem has been conceived.

The present invention has been made in view of the above circumstances, and an object thereof is to provide a SiC epitaxial wafer having high in-plane uniformity in n-type doping concentration of a high concentration layer.

The present invention provides the following means for solving the above problems.

(1) A SiC epitaxial wafer according to a first aspect of the present invention includes a SiC single crystal substrate, and a high concentration layer that is provided on the SiC single crystal substrate and has an average value of a doping concentration of $1\times10^{18}/cm^3$ or more and $1\times10^{19}/cm^3$ or less, and in-plane uniformity of the doping concentration of 30% or less.

The first aspect preferably includes the following features. One or more of the following features may be combined with each other.

(2) In the SiC epitaxial wafer according to the above aspect, the high concentration layer may be a buffer layer, and a drift layer having an average value of a doping concentration lower than an average value of the doping concentration of the buffer layer may be provided on the buffer layer.

(3) In the SiC epitaxial wafer according to the above aspect, the in-plane uniformity of the high concentration layer may be 20% or less.

(4) In the SiC epitaxial wafer according to the above aspect, the in-plane uniformity of the high concentration layer may be 10% or less.
(5) The SiC epitaxial wafer according to the above aspect may have a diameter of the wafer of 150 mm or more.
(6) The in-plane uniformity may be obtained by using an expression of (an absolute value of (a maximum value of the doping concentration–a minimum value of the doping concentration)/an average value of the doping concentration).
(7) The SiC epitaxial wafer may include a SiC epitaxial layer, and the SiC epitaxial layer may contain the high concentration layer.
(8) The SiC epitaxial layer may include the high concentration layer, and a drift layer that is provided on the high concentration layer and has an average value of a doping concentration lower than that of the high concentration layer.
(9) The doping concentration may be an N doping concentration.
(10) As a manufacturing method according to a second aspect of the present invention, a method for manufacturing a SiC epitaxial wafer is provided, which includes a step of preparing a chemical vapor deposition device, and a film formation step of forming a film by epitaxial growth on a SiC single crystal substrate in the chemical vapor deposition device, and the SiC epitaxial wafer that includes the SiC single crystal substrate, and a high concentration layer, that is provided on the SiC single crystal substrate and has an average value of an n-type doping concentration of $1\times10^{18}/cm^3$ or more and $1\times10^{19}/cm^3$ or less and in-plane uniformity of the doping concentration of 30% or less, is obtained through the film formation step.

The second aspect preferably includes the following features. One or more of the following features may be combined with each other.
(11) It is preferable that the film formation step includes a step of flowing a Si-based raw material gas, a C-based raw material gas, and a dopant gas onto the SiC single crystal substrate to form an epitaxial film serving as the high concentration layer, and the epitaxial film is formed under a condition that an average value of an n-type doping concentration of the film is $1\times10^{18}/cm^3$ or more and $1\times10^{19}/cm^3$ or less, and a condition that a C/Si ratio, which is a molar ratio of C atoms in the C-based raw material gas to Si atoms in the Si-based raw material gas, is 1.1 or more and 1.7 or less.
(12) It is preferable that the chemical vapor deposition device has a plurality of Si-based gas supply pipes and a plurality of C-based gas supply pipes, wherein positions of the pipes which supply the gases to the substrate are adjustable in an in-plane direction of the substrate.
(13) It is preferable to include, before the step of forming the epitaxial film, a step of determining a position of the C-based gas supply pipes of the chemical vapor deposition device, and a step of determining a position of the Si-based gas supply pipes thereof.
(14) It is preferable that the step of determining the position of the C-based gas supply pipes has a first sub-step of supplying the dopant gas under a condition that a carrier concentration of an obtained epitaxial film is less than $1\times10^{17}/cm^3$ and supplying the Si-based gas and the C-based gas under a condition of a C/Si ratio of 0.6 to 0.9 onto a SiC single crystal substrate using the chemical vapor deposition device to obtain the epitaxial film, a second sub-step of confirming a film thickness distribution of the epitaxial film obtained in the first sub-step, a third sub-step of determining a position of the C-based gas supply pipes without moving them in a case in which the film thickness distribution is 10% or less and moving the position of the C-based gas supply pipes in a case in which the film thickness distribution is not 10% or less, and a fourth sub-step of repeating the first to third sub-steps until the film thickness distribution becomes 10% or less, and that the step of determining the position of the Si-based gas supply pipes has a first sub-step of supplying the dopant gas under a condition that a carrier concentration of an obtained epitaxial film is less than $1\times10^{17}/cm^3$ and supplying the Si-based gas and the C-based gas under a condition of a C/Si ratio of 1.1 to 1.2 onto a SiC single crystal substrate using the chemical vapor deposition device, in which the position of the C-based gas supply pipes has been determined in the step of determining the position of the C-based gas supply pipes, to obtain the epitaxial film, a second sub-step of confirming a film thickness distribution of the epitaxial film obtained in the first sub-step, a third sub-step of determining a position of the Si-based gas supply pipes without moving them in a case in which the film thickness distribution is 10% or less and moving the position of the Si-based gas supply pipes in a case in which the film thickness distribution is not 10% or less, and a fourth sub-step of repeating the first to third sub-steps until the film thickness distribution becomes 10% or less.

According to the SiC epitaxial wafer of the present invention and the manufacturing method thereof, it is possible to provide a SiC epitaxial wafer having high in-plane uniformity in n-type doping concentration of a high concentration layer.

DETAILED DESCRIPTION OF THE INVENTION

Figure 1:
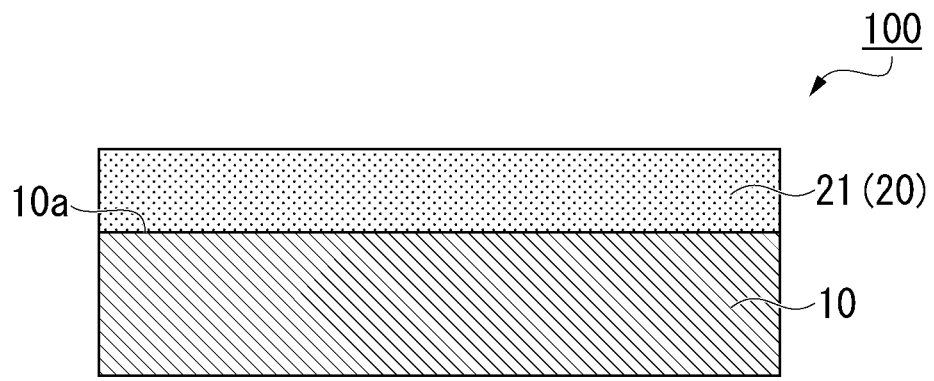
FIG. 1 is a schematic cross-sectional view showing an example of a SiC epitaxial wafer according to one embodiment of the present invention.

Hereinafter, examples of preferred embodiments of the present invention will be described with reference to the drawings. In addition, in each of the following embodiments, the same or equivalent parts may be designated by the same reference numerals in the drawings. Also, in the drawings used in the following description, featured portions may be enlarged for convenience in order to make the features easy to understand, and dimensional ratios and the like of each component are not always the same as actual ones. Further, materials, dimensions, and the like exemplified in the following description are examples, and the present invention is not limited thereto but can be carried out with appropriate changes as long as the effects of the present invention are achieved. A configuration shown in one embodiment can also be applied to other embodiments. For example, the present invention is not limited to the following examples, and additions, omissions, substitutions, and changes can be made to numbers, quantities, ratios, compositions, types, positions, materials, sizes, configurations, and the like without departing from the spirit of the present invention.

(SiC Epitaxial Wafer)

Figure 2:
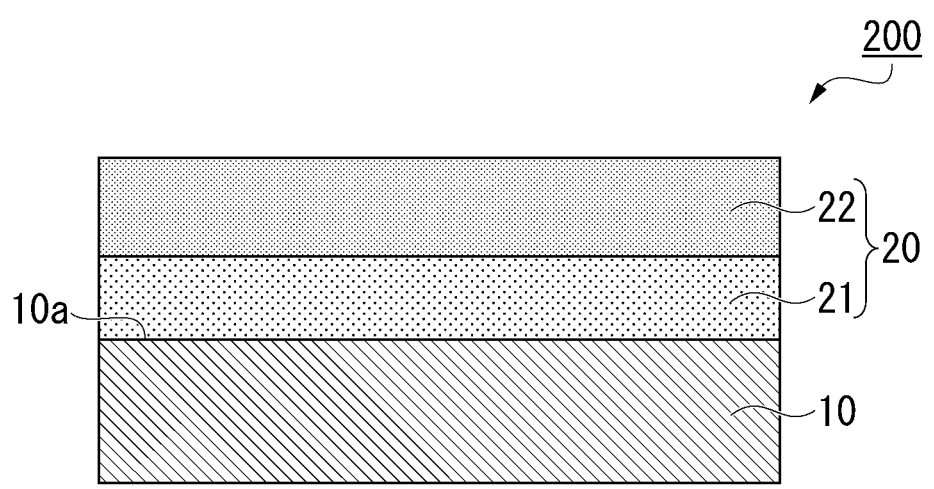
FIG. 2 is a schematic cross-sectional view showing an example of a SiC epitaxial wafer according to another embodiment of the present invention.

FIG. 1 is a schematic cross-sectional view showing an example of a SiC epitaxial wafer according to one embodiment of the present invention. FIG. 2 is a schematic cross-sectional view showing an example of a SiC epitaxial wafer according to another embodiment.

A SiC epitaxial wafer 100 shown in FIG. 1 includes a SiC single crystal substrate 10 and a SiC epitaxial layer 20 formed on a main surface 10a of the SiC single crystal substrate 10.

The SiC epitaxial layer 20 included in the SiC epitaxial wafer 100 is configured of a high concentration layer 21 that has an average value of a doping concentration of $1\times10^{18}/cm^3$ or more and $1\times10^{19}/cm^3$ or less, and in-plane uniformity of the doping concentration of 30% or less. Also, the doping concentration may be a concentration of a dopant element used as a dopant, and may be a doping concentration of nitrogen (N), for example.

In a SiC epitaxial wafer 200 shown in FIG. 2, a SiC epitaxial layer 20 includes a high concentration layer 21, which is a buffer layer, and a drift layer 22 that is provided on the buffer layer and has an average value of the doping concentration lower than an average value of the doping concentration of the buffer layer.

<SiC Single Crystal Substrate>

For the SiC single crystal substrate 10, a substrate obtained by slicing a SiC ingot obtained by a sublimation method or the like can be used. In the present specification, the SiC epitaxial wafer is a wafer having an epitaxial layer after the epitaxial layer is formed, and the SiC single crystal substrate is a wafer having no epitaxial layer before the epitaxial layer is formed.

A size of the SiC single crystal substrate 10 is not limited, and for example, a diameter thereof is preferably 100 mm or more, and more preferably 150 mm or more.

For the SiC single crystal substrate 10, a substrate with a plane having an offset angle in the <11-20> direction from (0001) serving as a growth plane can be used.

The SiC single crystal substrate 10 has basal plane dislocations along the (0001) plane (c plane). The number of the basal plane dislocations exposed on the growth plane of the SiC single crystal substrate is preferably small, but is not particularly limited.

In a case in which the SiC single crystal substrate 10 has a plane having an offset angle in the <11-20> direction from (0001) as the growth plane, the basal plane dislocations are tilted with respect to the growth plane.

The SiC single crystal substrate 10 may be formed under arbitrary conditions, and may be doped with nitrogen, for example. The doping concentration of the SiC single crystal substrate 10 is not particularly limited, and a normal substrate used as a SiC substrate for power semiconductors can be used.

<High Concentration Layer>

In the high concentration layer 21, an average value of an n-type doping concentration is $1\times10^{18}/cm^3$ or more and $1\times10^{19}/cm^3$ or less, and in-plane uniformity of the n-type doping concentration is 30% or less. That is, a value obtained by the aforementioned expression is 0.30 or less (30% or less). The in-plane uniformity of the n-type doping concentration of the high concentration layer 21 is preferably 25% or less, more preferably 20% or less, further preferably 15% or less, and particularly preferably 10% or less. A lower value of the in-plane uniformity of the n-type doping concentration is better for the quality of the SiC epitaxial wafer, but from the viewpoint of yield, a lower limit thereof can be set to 1% as an example of the lower limit. The lower limit of the in-plane uniformity may be 2%, 3%, or 5%. Dopants can be arbitrarily selected, and for example, nitrogen, ammonia, and the like can be used.

Regarding carriers in the epitaxial layer, in the basal dislocations of the SiC single crystal substrate at an interface between the epitaxial layer and the SiC single crystal substrate, +carriers (holes) and −carriers (electrons) are recombined, and the basal plane dislocations expand to the epitaxial layer. The high concentration layer 21 having carriers at a high concentration inhibits carriers in the epitaxial layer from reaching the SiC single crystal substrate.

In a case in which the high concentration layer 21 is a buffer layer, and the drift layer 22 is provided thereon, the high concentration buffer layer 21 and the drift layer 22 can be clearly distinguished due to a difference in doping concentration (an average value of the doping concentration).

When the inventors produced a SiC epitaxial wafer having a high concentration buffer layer and a drift layer in order on a SiC single crystal substrate by a general method, in-plane uniformity of a doping concentration of a high concentration buffer layer was 50% or more. That is, the in-plane uniformity was poor.

However, as a result of examination, it was found that a high concentration layer having an in-plane uniformity of a doping concentration of 30% or less can be manufactured by using a manufacturing method, which will be described later. Also, for the in-plane uniformity of the doping concentration, a smaller value indicates better uniformity, that is, the doping concentration is uniform and excellent in a plane.

When the in-plane uniformity of the doping concentration is poor, there is a region in a surface of a wafer in which the concentration is lower than a target concentration. As a result, there arises a problem of reducing an effect on carrier recombination, or a problem of causing defects due to high concentration since there is a region in a surface of a wafer in which the concentration is higher than the target concentration. These problems can be prevented by setting the in-plane uniformity to a good state of 30% or less.

The high concentration layer 21 is n-type, and nitrogen is used as an impurity to be doped.

The average value of the n-type doping concentration of the high concentration layer 21, that is, an average value of a nitrogen concentration of the high concentration layer 21, is $1\times10^{18}/cm^3$ or more and $1\times10^{19}/cm^3$ or less. For example, the average value of the n-type doping concentration of the high concentration layer 21 may be $1.2\times10^{18}/cm^3$ or more and $9\times10^{18}/cm^3$ or less, may be $1.5\times10^{18}/cm^3$ or more and $8\times10^{18}/cm^3$ or less, may be $2\times10^{18}/cm^3$ or more and $7\times10^{18}/cm^3$ or less, may be $3\times10^{18}/cm^3$ or more and $6\times10^{18}/cm^3$ or less, or the like.

A film thickness of the high concentration layer 21 is not particularly limited, and can be, for example, about 1 μm to 10 μm. For example, it may be 2 μm to 8 μm, 3 μm to 6 μm, or the like. If it is too thin, an effect of inhibiting carriers from reaching the SiC single crystal substrate is diminished, and if it is too thick, the cost becomes high.

A film thickness distribution of the high concentration layer 21 is preferably 10% or less. The film thickness distribution may be a value obtained from the expression represented by an absolute value of (the maximum value of a film thickness of the high concentration layer 21–the minimum value of the film thickness of the high concentration layer 21)/an average value of the film thickness of high concentration layer 21. That is, a value obtained by the above expression is preferably 0.10 or less (10% or less).

This is because, when the film thickness distribution of the high concentration layer 21 is 10% or less, at least one of an in-plane distribution of C-based gas supply on a substrate surface and an in-plane distribution of Si-based gas supply on the substrate surface can be as little as 10% or less, and thus a surface of the high concentration layer 21 tends to be a mirror surface. The in-plane distributions of the gas supplies on the substrate surface can be obtained by measuring the film thickness of the epitaxial wafer formed under a rate-determining condition, which will be described later.

<Drift Layer>

The high concentration layer 21 can be used as a buffer layer (intermediate layer), and the drift layer 22 can be provided on the buffer layer (intermediate layer).

The drift layer 22 is a layer through which a drift current flows and functions as a device. The drift current is a current generated by a flow of carriers when a voltage is applied to a semiconductor. The doping concentration of the drift layer 22, that is, the nitrogen concentration of the drift layer 22, is, for example, $1\times10^{14}/cm^3$ or more and $1\times10^{17}/cm^3$ or less, and is usually about $1\times10^{16}/cm^3$.

<Method for Measuring Doping Concentration>

The n-type doping concentration of the high concentration layer can be measured by a mercury probe (Hg—CV) method or a secondary ion mass spectrometry (SIMS) method.

In the Hg—CV method, $N_d$–$N_a$ is measured as the n-type doping concentration. Here, $N_d$ is a donor concentration and $N_a$ is an acceptor concentration. If it is confirmed that $N_a$ is sufficiently smaller than $N_d$, it can be considered that $N_d$–$N_a \approx Nd$.

When the secondary ion mass spectrometry (SIMS) method is used, measurement is performed while scraping a high concentration layer in a depth direction of a SiC epitaxial wafer including the high concentration layer, and thus the doping concentration of the high concentration layer can be measured. The same applies to a SiC epitaxial wafer including a drift layer on a high concentration layer.

Measurement points may be any point as long as the distribution in the wafer surface can be reflected. However, the measurement points include at least a wafer center, and a measurement point at a position 5 mm from a wafer edge, which is a measurement point farthest from the wafer center. Points less than 5 mm from the edge are not included as the measurement points.

As a specific procedure for measuring the n-type doping concentration of the high concentration layer, for example, in the case of a 6-inch wafer, the measurement may be performed in directions of a cross with a center of the wafer set as an origin thereof at locations of the center and a plurality of points on lines from the center toward an outer periphery thereof. For example, the n-type doping concentration is measured at 21 points (example: 21 measurement points on two lines intersecting at a 90 degree angle at the center). The average value of the n-type doping concentration is calculated using the n-type doping concentration obtained at each point, and an absolute value of a difference between the maximum value and the minimum value of the n-type doping concentration is divided by the calculated average value of the n-type doping concentration. The in-plane uniformity can be obtained by this calculation.

One of the directions of the cross can be parallel to an orientation flat.

<Other Layers>

The SiC epitaxial wafer of the present invention may include other layers as long as the effects of the present invention are achieved.

For example, another buffer layer (hereinafter referred to as a first buffer layer) of an n-type or p-type semiconductor having an impurity concentration (the doping concentration) lower than that of the SiC single crystal substrate 10 may be provided between the SiC single crystal substrate 10 and the high concentration layer 21. The first buffer layer can be provided on the wafer in order to convert basal plane dislocations into threading edge dislocations. From this point of view, the first buffer layer is a BPD conversion layer.

The impurity concentration of the first buffer layer is preferably lower than the impurity concentration of the SiC single crystal substrate 10 and is preferably equal to or lower than the impurity concentration of the high concentration layer 21. As a value of the impurity concentration of the first buffer layer, for example, the nitrogen concentration is preferably $1\times10^{17}/cm^3$ or more. The value of the impurity concentration of the first buffer layer is preferably $1\times10^{19}/cm^3$ or less. For example, the value of the impurity concentration of the first buffer layer may be $3\times10^{17}/cm^3$ or more and $8\times10^{18}/cm^3$ or less, may be $5\times10^{17}/cm^3$ or more and $4\times10^{18}/cm^3$ or less, may be $7\times10^{17}/cm^3$ or more and $2\times10^{18}/cm^3$ or less, or the like.

The impurity concentration of the first buffer layer can be set to be intermediate between both impurity concentrations of the SiC single crystal substrate 10 and the high concentration layer 21 in order to alleviate a lattice mismatch between the SiC single crystal substrate 10 and the high concentration layer 21.

(Method for Manufacturing SiC Epitaxial Wafer)

A method for manufacturing the SiC epitaxial wafer 100 or the SiC epitaxial wafer 200 according to the present embodiment is a method for performing crystal growth of the epitaxial layer 20, for example, on the SiC single crystal substrate 10 whose main surface has an off angle of 0.4° to 5° with respect to the (0001) plane.

First, the SiC single crystal substrate 10 is prepared. A method for producing the SiC single crystal substrate 10 is not particularly limited. For example, the substrate can be obtained by slicing a SiC ingot obtained by a sublimation method or the like.

Next, the SiC epitaxial layer 20 (layers such as the high concentration layer 21 and the drift layer 22) is epitaxially grown on the prepared SiC single crystal substrate 10 to produce the SiC epitaxial wafer 100. The SiC epitaxial layer 20 can be formed by performing step-flow growth (lateral growth from an atomic step) on a growth plane 10a of the SiC single crystal substrate 10 by a chemical vapor deposition (CVD) method.

A step of forming the SiC epitaxial layer 20 is performed by flowing a raw material gas and a dopant gas on the SiC single crystal substrate, more specifically, on the SiC single crystal substrate held at a high temperature.

The raw material gas is a gas serving as a raw material when the SiC epitaxial layer is formed. In general, for the raw material gas, a Si-based raw material gas containing Si in a molecule (Si-based gas) and a C-based raw material gas containing C in a molecule (C-based gas) can be used in combination with each other.

As the Si-based raw material gas, a known gas can be used, and for example, silane ($SiH_4$) can be mentioned. In addition, for the Si-based raw material gas, a chlorine-based Si raw material-containing gas (a chloride-based raw material) containing Cl having an etching function, such as dichlorosilane ($SiH_2Cl_2$), trichlorosilane ($SiHCl_3$), or tetrachlorosilane ($SiCl_4$), can also be used. For the C-based raw material gas, for example, propane ($C_3H_8$), ethylene ($C_2H_4$), or the like can be used.

The dopant gas is a gas containing an element serving as a donor or acceptor (carriers). In order to grow an n-type epitaxial layer, nitrogen, ammonia, or the like can be used for the dopant gas. In order to grow a p-type epitaxial layer, trimethylaluminum (TMA), triethylaluminum (TEA), or the like can be used for the dopant gas.

In addition thereto, a gas or the like for transporting these gases into a reactor may be used at the same time. For example, hydrogen, which is inert to SiC, can be used.

In a case in which the SiC epitaxial wafer 100 is manufactured, the step of forming the SiC epitaxial layer 20 is a high concentration layer step of forming the high concentration layer 21 on the SiC single crystal substrate 10. In a case in which the SiC epitaxial wafer 200 is manufactured, the step of forming the SiC epitaxial layer 20 includes the high concentration layer step of forming the high concentration layer 21 on the SiC single crystal substrate 10, and a drift layer step of forming a drift layer on the high concentration layer 21.

<High Concentration Layer Step>

A growth temperature in the high concentration layer step can be arbitrarily selected, for example, to be 1400 to 1800° C., and is more preferably 1500 to 1700° C. When the temperature is too low, polytypes other than 4H are likely to be generated. When the temperature is too high, surface roughness is likely to be generated.

In the present embodiment, the C/Si ratio is a molar ratio of C atoms in the C-based raw material gas to Si atoms in the Si-based raw material gas and means a C/Si ratio of the raw material gases. As for the C/Si ratio of the raw material gases, as will be described later, the higher the C/Si ratio of the raw material gases, the higher the in-plane uniformity of the doping concentration. On the other hand, when an attempt is made to increase the doping concentration, an amount of doping gas increases, and thus an effective C/Si ratio decreases. That is, for example, since N tries to enter a C site, a proportion of C that contributes to film formation decreases as compared with Si that contributes to the film formation. As described above, the C/Si ratio is a molar ratio of C atoms in the C-based raw material gas to Si atoms in the Si-based raw material gas. Thus, the C/Si ratio of the raw material gases to be supplied must be further increased to compensate for the above-mentioned decrease. That is, for example, when an average value of the target doping concentration is $1 \times 10^{18}/cm^3$ to $5 \times 10^{18}/cm^3$, the C/Si ratio is preferably 1.1 or more and 1.5 or less, and more preferably 1.2 or more and 1.4 or less. Further, when the target concentration is higher and $5 \times 10^{18}/cm^3$ to $1 \times 10^{19}/cm^3$, the C/Si ratio is also higher, preferably 1.3 or more and 1.7 or less, and more preferably 1.4 or more and 1.6 or less.

That is, in the present embodiment, in order to form the high concentration layer, an epitaxial film servings as the high concentration layer is formed under the condition that the average value of the n-type doping concentration of the film is $1 \times 10^{18}/cm^3$ or more and $1 \times 10^{19}/cm^3$ or less, and the condition that the C/Si ratio, which is the molar ratio of the C atoms in the C-based raw material gas to the Si atoms in the Si-based raw material gas, is 1.1 or more and 1.7 or less.

When the high concentration layer is formed, it is necessary to dope a large amount of impurities such as nitrogen in order to achieve a high concentration. In this case, the C/Si ratio is lowered in general. That is, the proportion of C in the material gas used is lowered, and/or the proportion of Si is raised. This is because if an attempt is made to dope at a high concentration while keeping the C/Si ratio as it is, it is necessary to introduce a large amount of doping gas. By lowering the C/Si ratio, the introduced amount of the doping gas is prevented from becoming too large.

On the other hand, as a result of the inventors' diligent studies, it has been found that lowering the C/Si ratio when the high concentration layer is formed causes a decrease in the in-plane uniformity of the n-type doping concentration. In addition, it has been found that, when the high concentration layer is formed, the film formation is performed using a higher C/Si ratio than usual, and thus it is possible to inhibit a decrease in the in-plane uniformity of the n-type doping concentration. Further, it has been found that, in order to achieve mirroring on the entire surface of the wafer, it is important that the in-plane distribution of the C-based gas supply and the Si-based gas supply on the substrate surface is good before the high concentration layer is formed.

<<Confirmation of In-Plane Distribution of C-Based Gas Supply and Si-Based Gas Supply on Substrate Surface>>

As will be described later, when the high concentration layer is formed, film formation (formation of the SiC epitaxial layer) is performed on the SiC single crystal substrate using a predetermined C/Si ratio higher than usual, and thus the high concentration layer whose entire surface is a mirror surface can be formed. However, a non-mirror surface region might be generated in a part thereof. This non-mirrored region often ranged in size from 5% to 50% of the total area. By diligently studying the phenomenon in which the non-mirror surface region was generated, it was found that a cause of the above generation was that the in-plane distribution of the C-based gas supply and the Si-based gas supply on the substrate surface was not good. It was found that, in order to improve this generation, it is effective to utilize a configuration of a device, a manufacturing method, or the like that can independently control each in-plane distribution of the C-based gas and the Si-based gas supply in gas supply to a film forming device such as a chemical vapor deposition device. Also, in the present embodiment, the surface of the high concentration layer may be a mirror surface as a whole, or may or may not have a non-mirror surface region, and a proportion of the region is preferably 0 to 5%, more preferably 0 to 3%, further preferably 0 to 2%, and particularly preferably 0 to 1%.

Figure 3:
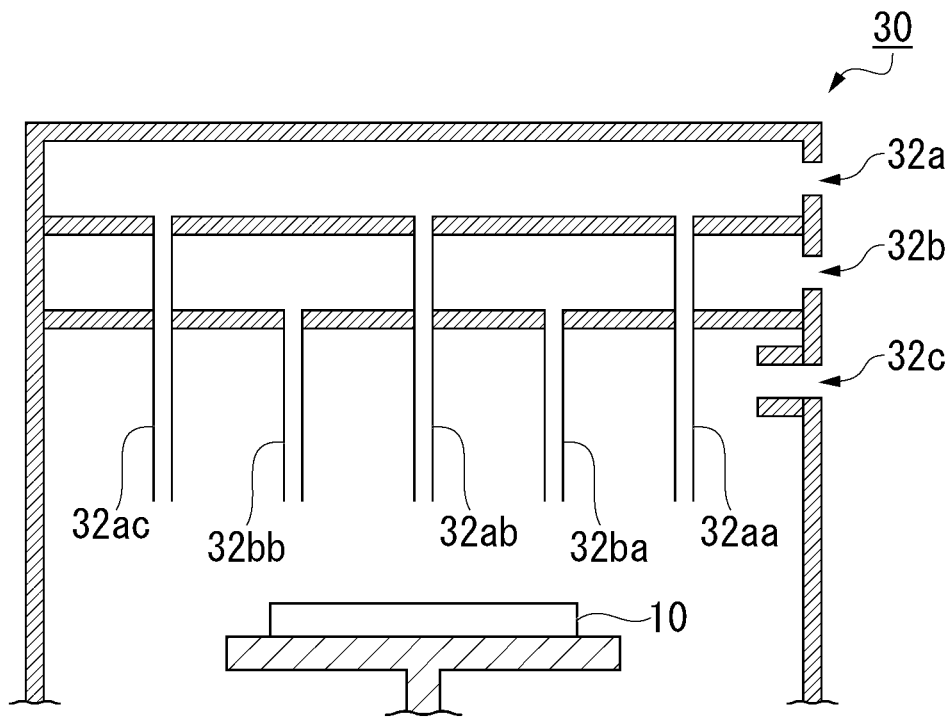
FIG. 3 is a schematic cross-sectional view showing one example of a configuration for a device and a method with which an in-plane distribution of C-based gas (C-based raw material gas) supply and Si-based gas (Si-based raw material gas) supply can be independently controlled.

FIG. 3 shows a preferred example of a configuration in which the in-plane distribution can be controlled independently by supplying the C-based gas and the Si-based gas. In the present embodiment, a chemical vapor deposition device having a plurality of Si-based gas supply pipes and a plurality of C-based gas supply pipes which can adjust gas supply positions to the substrate in an in-plane direction of the substrate can be preferably used. However, the present embodiment is not limited to this example.

A vertical type film forming device 30 as shown in FIG. 3 has a gas introduction unit. The gas introduction unit has gas supply units 32a, 32b, and 32c, which supply respective gases from an upper part to a lower part in the device toward a placed substrate 10. The gas supply unit may have each introduction port into which each gas is introduced into the device, and each space to which each gas is supplied from each supply port. Specifically, the gas introduction unit includes a supply unit 32a for supplying only the C-based gas and a supply unit 32b for supplying only the Si-based gas. Each of the supply unit 32a for supplying only the C-based gas and the supply unit 32b for supplying only the Si-based gas is configured to have a structure in which supply positions toward the substrate 10 can be independently adjusted in a horizontal direction (the in-plane direction of the substrate). For example, the positions of the gas supply pipes described below can be adjusted in the horizontal direction. In addition, for example, a carrier gas and/or dopant gas is supplied to the gas supply unit 32c. Also, the carrier gas may also be supplied to the supply units 32a and 32b. The gas supply unit 32c may be a space in which film formation is performed, or may not have a gas supply pipe. Further, a dopant gas may be supplied from the C-based gas supply unit, from the Si-based gas supply unit, and/or from the carrier gas supply unit. In the example shown in FIG. 3, the C-based gas supply unit 32a includes gas supply pipes 32aa, 32ab, and 32ac, which are disposed at predetermined arbitrary intervals and extend in a direction perpendicular to the in-plane direction. The Si-based gas supply unit 32b includes gas supply pipes 32ba and 32bb, which are disposed at predetermined arbitrary intervals and extend in the direction perpendicular to the in-plane direction. These gas supply pipes can be connected to each of the above spaces. The number of gas supply pipes for supplying the C-based gas and the number of gas supply pipes for supplying the Si-based gas may be the same or different. The number of gas supply pipes for each gas can be arbitrarily selected and may be, for example, 2 to 40, 5 to 20, 8 to 15, or the like, but is not limited to these examples. Positions of end portions (gas discharge end portions) of these gas supply pipes may be at the same height when seen in a side view.

Here, the in-plane distribution of the C-based gas supply on the substrate surface can be measured by measuring a film thickness distribution (a growth rate distribution) of the epitaxial wafer formed under a C supply rate-determining condition, as will be described later. In the present specification, the in-plane distribution of the gas supply on the substrate surface indicates an "absolute value of (the maximum value of a film thickness of the epitaxial wafer–the minimum value of film thickness of epitaxial wafer)/average value of film thickness of epitaxial wafer." Further, the thickness of the SiC epitaxial wafer can be measured by a known method, for example, Fourier transform infrared spectroscopy (FT-IR). The C supply rate-determining condition is a state in which supply of the C-based gas is insufficient as compared with the Si-based gas. The C supply rate-determining condition preferably is within the range of a C/Si ratio of 0.6 to 0.9. For example, it is conceivable to carry out the above film formation with a C/Si ratio of 0.8. However, the film is formed under the condition that a carrier concentration of the epitaxial wafer is, that is, a doping concentration of the epitaxial film of the epitaxial wafer is less than $1 \times 10^{17}/cm^3$ so that an input amount of an N-based gas such as nitrogen does not change the effective C/Si ratio. It is also preferable to confirm the film thickness distribution of the obtained epitaxial film and repeat change of the supply position of the C-based gas and confirmation of the in-plane distribution of the obtained film until a desired in-plane distribution (film thickness distribution) is achieved.

On the other hand, the in-plane distribution of the Si-based gas supply on the substrate surface can be measured by measuring the film thickness distribution (growth rate distribution) of the epitaxial wafer formed under a Si supply rate-determining condition. The Si supply rate-determining condition is a state in which supply of the Si-based gas is insufficient as compared with the C-based gas. The Si supply rate-determining condition is preferably within the range of a C/Si ratio of 1.1 to 1.2. For example, it is conceivable to carry out the above film formation with a C/Si ratio of 1.1. However, it is preferable to form the film under the condition that the carrier concentration of the epitaxial wafer is less than $1 \times 10^{17}/cm^3$ so that an input amount of the N-based gas does not change the effective C/Si ratio. It is also preferable to confirm the film thickness distribution of the obtained epitaxial film and repeat change of the supply position of the Si-based gas and confirmation of the in-plane distribution of the obtained film until a desired in-plane distribution (film thickness distribution) is achieved.

In this way, using the above configuration, for example, by the method described later, the in-plane distribution of the C-based gas supply (the film thickness distribution of the epitaxial wafer formed under the C supply rate-determining condition) and the in-plane distribution of the Si-based gas supply (the film thickness of the epitaxial wafer formed under the Si supply rate-determining condition) are measured, and in a case in which the in-plane distribution of the C-based gas supply is not 10% or less and the in-plane distribution of the Si-based gas supply is not 10% or less, the gas supply positions of the C-based gas supply unit and the Si-based gas supply unit, that is, the positions of the gas supply pipes are adjusted. For example, in a case in which supply of the C-based gas in the vertical type film forming device is smaller in the center and larger in the outer periphery, for example, in a case in which the film thickness of the film formed under the C supply rate-determining condition is thinner at the center, the position of the supply pipe of the C-based gas supply unit of the gas introduction unit is moved to the center side.

In this way, the present embodiment may include, before the step of forming the high concentration layer, a step of determining the positions at which each gas is supplied in accordance with the film thickness distribution of the film to be formed. Specifically, before the step of forming the high concentration layer, with respect to the device used for the formation, the present embodiment may include a step of determining the position of the C-based gas supply pipe and a step of determining the position of the Si-based gas supply pipe. These steps are preferably performed under the C or Si rate-determining condition, which will be described later. Also, either step may be performed first. For example, it is preferable that a position of one supply pipe be first determined, and then in a state in which the position is maintained, the step of determining a position of the other supply pipe be performed.

It was confirmed that, in a case in which the in-plane distribution on the substrate surface of the C-based gas supply, that is, the film thickness distribution, is 10% or less, and the in-plane distribution of the Si-based gas on the substrate surface is 10% or less, the non-mirror surface region was not generated in the high concentration layer.

(Measurement of In-Plane Distribution in Growth Rate Under C Rate-Determining and Si Rate-Determining)

Prior to preparing samples described below, supply positions of the C-based gas supply unit and the Si-based gas supply unit of the film forming device were adjusted, and in-plane distributions in growth rate under C rate-determining and Si rate-determining was measured. That is, a film thickness distribution of a formed film was measured. For the measurement, a chemical vapor deposition (CVD) device as outlined in FIG. 3 was used.

(i) C Rate-Determining

A film was formed by adjusting an amount of nitrogen such that the obtained doping concentration was $8\times10^{15}/cm^3$ at a C/Si ratio of 0.8. Then, by adjusting the position of only the supply pipe of the C-based gas supply unit, the in-plane distribution of the C-based gas supply on the substrate surface was set to 5.6%. The position of the supply pipe of the Si-based gas supply unit was not adjusted.

(ii) Si Rate-Determining

A film was formed by adjusting an amount of nitrogen such that the obtained doping concentration was $1.3\times10^{16}/cm^3$ at a C/Si ratio of 1.1. Then, by adjusting the position of only the supply pipe of the Si-based gas supply unit, the in-plane distribution of the Si-based gas supply on the substrate surface was set to 3.4%. Further, the supply pipe of the C-based gas supply unit was left fixed at the position set under C rate-determining.

The in-plane distribution of the C-based gas supply and the in-plane distribution of the Si-based gas supply were measured at 21 points in the wafer in the same manner as the in-plane uniformity of the n-type doping concentration described below.

(Sample Preparation and Measurement of In-Plane Uniformity of n-Type Doping Concentration of Sample)

Using the film forming device in which adjustment of the positions has been completed, a 4H—SiC single crystal substrate having a diameter of 150 mm and a main surface with an off angle of 4°, and nitrogen serving as an n-type dopant, samples in which a high concentration epitaxial layer was formed on an Si surface of the substrate was produced while varying manufacturing conditions. Table 1 shows results of examining the in-plane uniformity of the n-type doping concentration of the high concentration epitaxial layer of the manufactured samples. As for specific manufacturing conditions and measurements, a plurality of samples (wafers) were manufactured by setting the C/Si ratio of the raw material gases to any of 1.05, 1.15, and 1.35, and changing conditions regarding a doping gas to be introduced, and 21 points in the surface of the wafer were measured. The in-plane uniformity is the in-plane uniformity of the n-type doping concentration of the high concentration epitaxial layer of the wafer obtained by introducing the doping gas aiming at a predetermined value as an average value of the doping concentration. All samples were produced under the same conditions except that the C/Si ratio and a flow rate of the doping gas (nitrogen) were changed. While the unit is set to mm, the center of the wafer is (0,0), and the orientation flat is in the Y direction, the measurement points are (X, Y)=(0, 70), (0, 60), (0, 45), (0, 30), (0, 15), (0, 0), (0, −15), (0, −30), (0, −45), (0, −60), (0, −67), (−70, 0), (−60, 0), (−45, 0), (−30, 0), (−15, 0), (15, 0), (30, 0), (45, 0), (60, 0), and (70, 0). The numerical values in parentheses are distances (mm) from the center.

Figure 4:
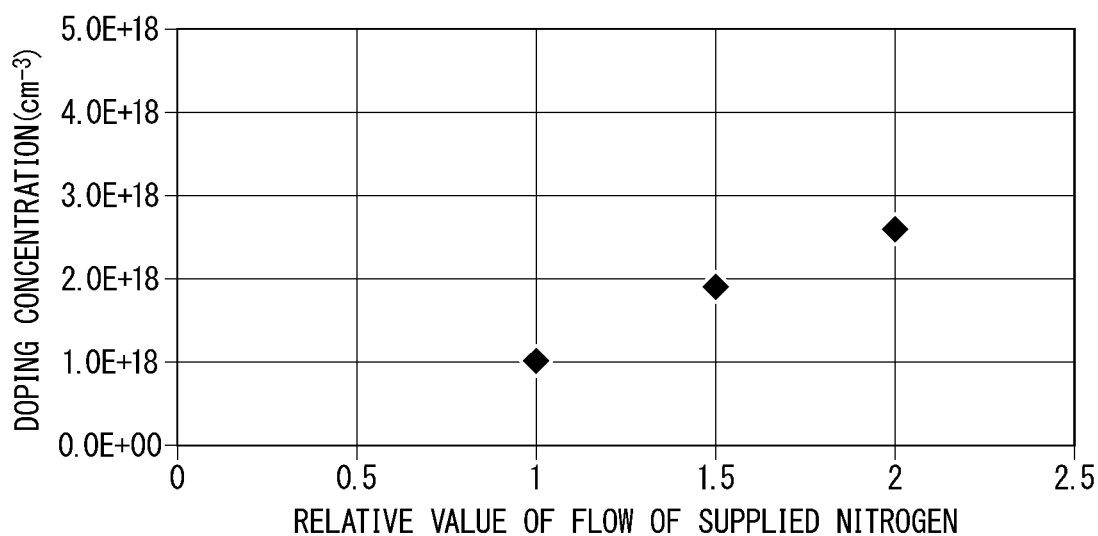
FIG. 4 is a graph showing a relationship between an input nitrogen flow rate and an obtained doping concentration (average value) for three samples shown in Table 1 when a C/Si ratio is 1.15.

Further, a higher doping concentration (average value) can be achieved by increasing the flow rate of supplied nitrogen. FIG. 4 shows a relationship between a relative value of the flow rate of supplied nitrogen and an obtained doping concentration (average value) in a case in which the flow rate of nitrogen varied for three samples when the C/Si ratio shown in Table 1 was set to 1.15. In FIG. 4, the horizontal axis is a relative value of the flow rate of supplied nitrogen in a case in which the flow rate of supplied nitrogen is set to 1 when the obtained doping concentration (average value) is $1.03\times10^{18}/cm^3$. The vertical axis is the obtained doping concentration (average value). It can be seen that the doping concentration increases as the flow rate of nitrogen increases. As the film forming device, the vertical type device as shown in FIG. 3 was used.

TABLE 1

| C/Si | Average value of doping concentration (cm$^{-3}$) | In-plane uniformity |
|---|---|---|
| 1.05 | 2.01E+18 | 31.6% |
| 1.05 | 4.24E+18 | 43.9% |
| 1.05 | 1.10E+19 | 115.8% |
| 1.15 | 1.03E+18 | 12.2% |
| 1.15 | 1.91E+18 | 14.0% |
| 1.15 | 2.59E+18 | 17.8% |
| 1.35 | 2.20E+18 | 6.1% |

As shown in Table 1, in the case of using the condition that a normally used C/Si ratio is 1.05, even when the average value of the n-type doping concentration is about $2\times10^{18}$ cm$^{-3}$, the in-plane uniformity of the n-type doping concentration exceeds 30%. Thus, it can be seen that, when the average value of the n-type doping concentration is increased, the value of the in-plane uniformity of the n-type doping concentration increases, and the in-plane uniformity further deteriorates.

On the other hand, in the case of using 1.15, which is higher than the normally used C/Si ratio, even when the average value of the n-type doping concentration is about $1\times10^{18}$ cm$^{-3}$, the in-plane uniformity value decreases, that is, the in-plane uniformity becomes 12.2%, and thus excellent and high in-plane uniformity of the n-type doping concentration is obtained. When the average value of the n-type doping concentration is raised to about $2.6\times10^{18}$ cm$^{-3}$, the value of the in-plane uniformity slightly increases, that is, the in-plane uniformity of the n-type doping concentration slightly decreases, but the value of the in-plane uniformity is 17.8%, which is still good.

Further, in the case of using 1.35, which is a C/Si ratio much higher than the normally used C/Si ratio, the value of the in-plane uniformity value decreases at the average value of the n-type doping concentration of $2.2\times10^{18}$ cm$^{-3}$, that is, extremely excellent and high in-plane uniformity of the n-type doping concentration, i.e., 6.1%, was obtained.

From the above results, it has been found that, by using a C/Si ratio higher than the normally used C/Si ratio of 1.05, the in-plane uniformity of the n-type doping concentration is improved, and the in-plane uniformity of the n-type doping concentration is further improved as the C/Si ratio becomes higher. Also, it has been found that increasing the average value of the n-type doping concentration deteriorates the in-plane uniformity of the n-type doping concentration regardless of which C/Si ratio is used.

Figure 5:
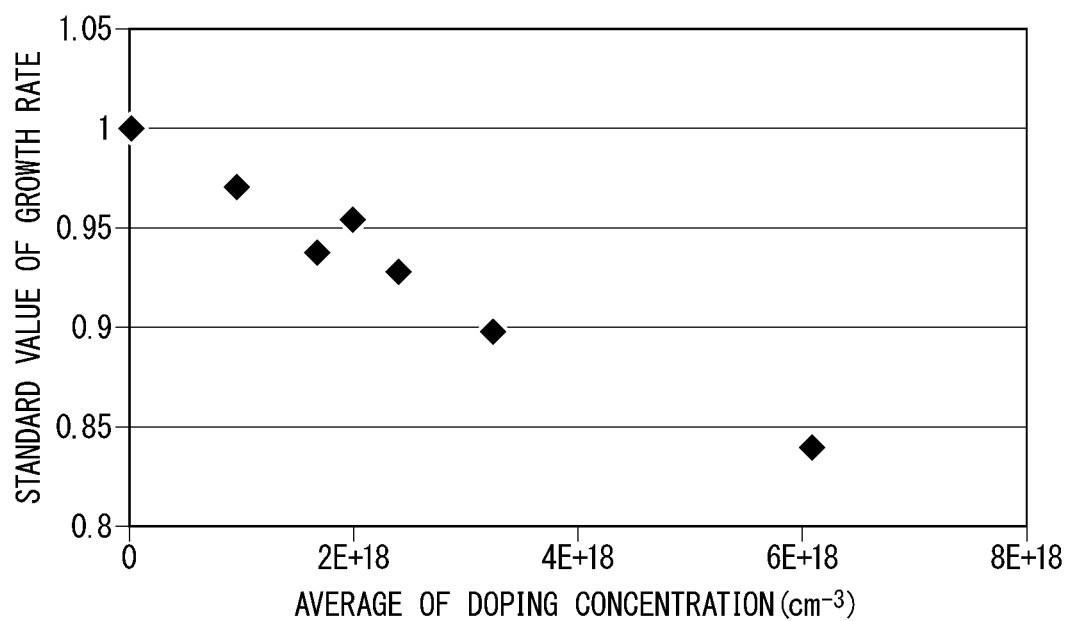
FIG. 5 is a graph showing results of examining a relationship between an average value of the doping concentration and a growth rate.

FIG. 5 shows results of examining a relationship between the average value of the n-type doping concentration and the growth rate for samples of the SiC epitaxial wafer having a diameter of 150 mm by performing measurements under the same conditions except that the doping condition was changed. Also, as the film forming device, the vertical type device as shown in FIG. 3 was used.

In FIG. 5, the horizontal axis is the average value of the n-type doping concentration. The vertical axis is a standard value of the growth rate when the growth rate is standardized by setting the growth rate of the epitaxial film to 1 in a case in which epitaxial growth is performed so that the average value of the n-type doping concentration is $1\times10^{16}$ cm$^{-3}$.

As shown in FIG. 5, it can be seen that the growth rate tends to decrease for the high concentration layer having a higher average value of the n-type doping concentration. This tendency is presumed to be due to the fact that nitrogen (N) inhibits growth of SiC (site-competition effect). This point will be described below.

Figure 6:
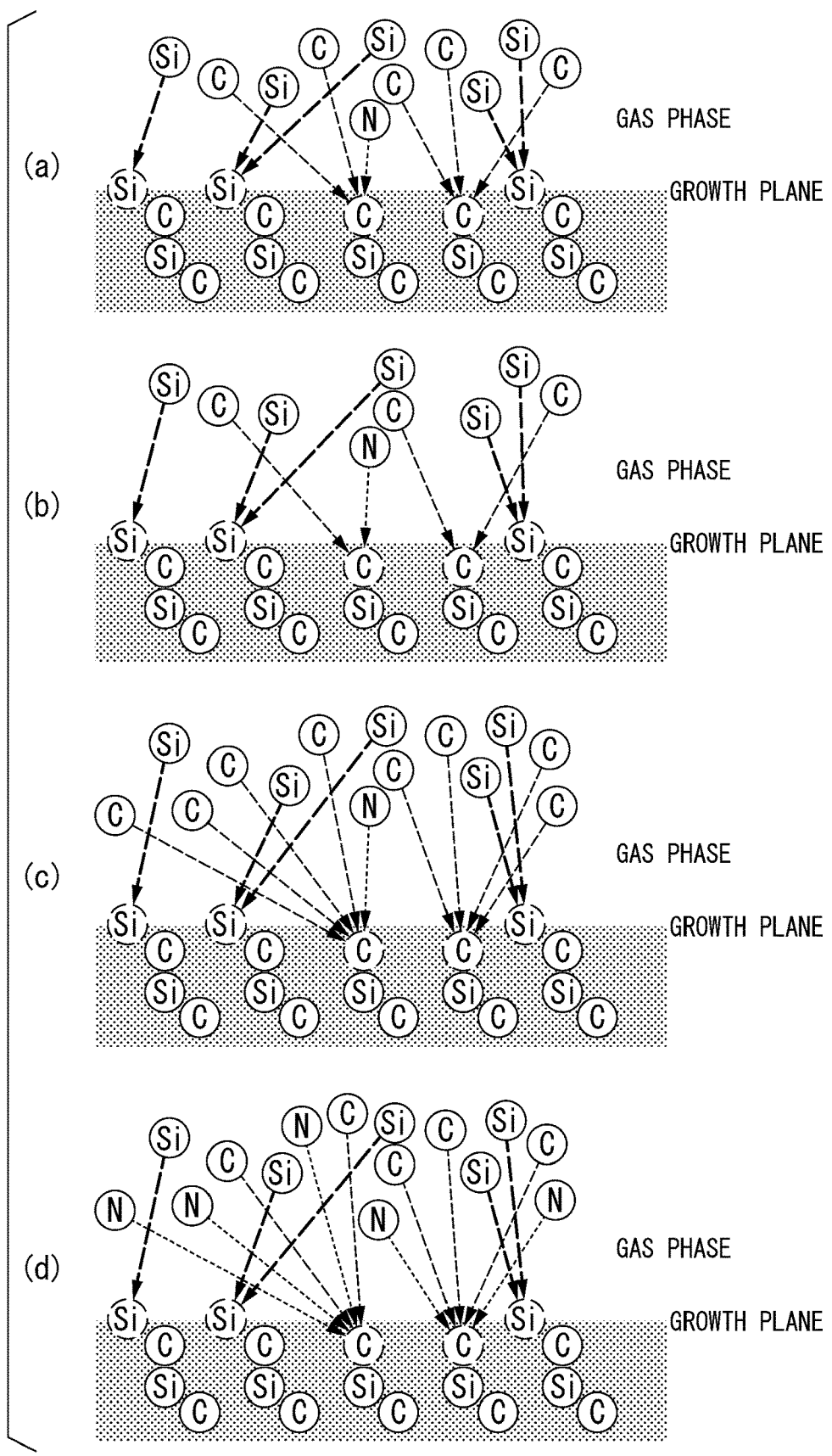
FIG. 6 shows (a) a basic image diagram of nitrogen (N) doping, (b) an image diagram in a case in which the C/Si ratio is lower than that of (a), (c) an image diagram in a case in which the C/Si ratio is higher than that of (a), and (d) a conceptual image diagram in a case in which a doping flow rate is larger than that of (a).

In FIG. 6, (a) to (d) are image diagrams of nitrogen (N) doping. They are figures showing a state in which nitrogen is about to enter a carbon lattice site of SiC. In FIG. 6, (b) shows a case in which the C/Si ratio is lower than that of (a), (c) shows a case in which the C/Si ratio is higher than that of (a), and (d) shows a case in which the flow rate of the doping gas is larger than that of (a) (when a high average value of the doping concentration is aimed at). Here, the state at the time of doping shown in (a) to (c) of FIG. 6 has been conventionally known as a site-competition effect, the state at the time of doping shown in (d) of FIG. 6 is a finding newly discovered by the present inventors. Further, in FIG. 6, the number x of C, the number y of Si, and the number z of N in a gas phase shown for convenience are set to x=5, y=5, z=1 in (a), x=3, y=5, z=1 in (b), x=8, y=5, z=1 in (c), and x=5, y=5, z=5 in (d).

As shown in (a) of FIG. 6, Si is incorporated into a Si site, C is incorporated into a C site, and N is incorporated into a C site.

On the other hand, in the case of a low C/Si ratio, as shown in (b) of FIG. 6, a ratio of N to C increases, and thus the probability of N entering the C site increases.

Further, in the case of a high C/Si ratio, as shown in (c) of FIG. 6, the ratio of N to C decreases, and the probability of N entering the C site decreases.

In addition, in a case in which N has a concentration as high as that of the raw material gases, the ratio of N to C increases as shown in (d) of FIG. 6.

For that reason, C is less likely to be incorporated into the C site, and as a result, the effective C/Si ratio is lowered and the growth rate is lowered.

Here, the inventors have examined the relationship between an input amount of the C-based gas and the growth rate by using the CVD device that has produced the samples for the measurement of the in-plane uniformity of the n-type doping concentration described above. As a result, a calibration curve shown in FIG. 7 was obtained, which shows a positive correlation that the growth rate increases as the input amount of the C-based gas increases.

From this calibration curve and the amount of decrease in growth rate that decreased by increasing the n-type doping concentration, it is possible to estimate a substantially insufficient input amount of the C-based gas. This will be described with reference to the conceptual diagram of FIG. 6 and FIG. 7.

Figure 7:
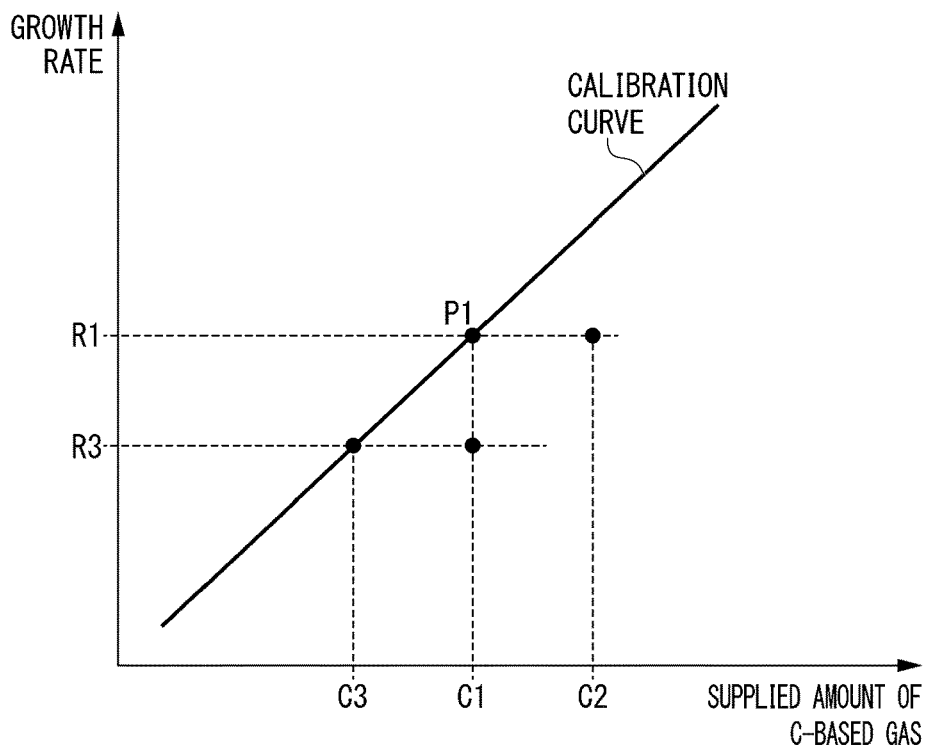
FIG. 7 is a graph for describing how a substantially insufficient input amount of C-based gas can be estimated from a calibration curve and an amount of decrease in growth rate.

In FIG. 7, the horizontal axis represents the input amount of the C-based gas, and the vertical axis represents the growth rate of the SiC epitaxial layer. Also, the input amount of the C-based gas corresponds to a C/Si ratio when an input amount of the Si-based gas input is fixed.

It is assumed that a SiC epitaxial wafer having a higher average value of the n-type doping concentration than an average value of the n-type doping concentration of the SiC epitaxial wafer obtained under the condition of P1 on the calibration curve (the input amount of the C-based gas is C1, and the growth rate is R1) is produced. Referring to the calibration curve of FIG. 7, if the flow rate of the doping gas is increased and the growth rate is R3 instead of R1 when epitaxial growth is performed with the input amount of the C-based gas of C1, it is considered that an effective input amount of the C-based gas, that is, an amount of C-based gas that contributed to the growth of the film, was C3. In this case, it is considered that since the ratio of N atoms to C atoms increased, it became difficult for C atoms to be incorporated into the C site, and as a result, the effective input amount of the C-based gas became C3. By adding an amount of C-based gas that compensate for this shortage, epitaxial growth can be performed at the growth rate R1.

The in-plane uniformity of the doping concentration will be described below with reference to Table 1 and FIG. 8.

As shown in Table 1, as a result of increasing the C/Si ratio to compensate for the shortage of the C-based gas, the in-plane uniformity of the n-type doping concentration was significantly improved, and at the time of the C/Si ratio=1.35, the in-plane uniformity was 6.1%.

When a SiC epitaxial layer having a normal concentration (for example, $1\times10^{16}$/cm$^3$ or less) was formed instead of one having a high doping concentration under the condition of the C/Si ratio=1.35, it became a non-mirror surface. However, in the SiC epitaxial layer having a high doping concentration formed under the condition of the C/Si ratio=1.35 shown in Table 1, the entire surface was a mirror surface. This is considered to support that the nitrogen (N) atoms inhibit the growth of SiC due to the above-mentioned site compensation effect.

When manufactured under the same C/Si ratio condition, the SiC epitaxial layer having a high doping concentration is considered to be more affected by the site compensation effect than the SiC epitaxial layer having a low doping concentration. In addition, it is considered that uniform growth of SiC on the growth plane is likely to be hindered, and as a result, the in-plane uniformity of the doping concentration is also impaired. Accordingly, it is considered that, in the SiC epitaxial layer having a high doping concentration, the influence of the site compensation effect is reduced by increasing the C/Si ratio, and as a result, it is possible to inhibit hindrance to uniform growth of SiC on the growth plane, that is, to carry out uniform growth of SiC and to inhibit deterioration of the in-plane uniformity of the doping concentration.

In this way, from the correlation between the input amount of the C-based gas and the growth rate (for example, the calibration curve) acquired in advance, the amount of dopant that hinders the epitaxial growth of SiC is estimated, that is, the insufficient amount of C is predicted, and the raw material gases are provided at the C/Si ratio that can compensates for that amount, and thus the SiC epitaxial wafer having high in-plane uniformity can be manufactured.

Also, in all of the samples obtained in Table 1, the entire surface of the high concentration layer was a mirror surface. That is, it has been confirmed that, in a case in which the high concentration layer was manufactured under the condition that the in-plane distribution of the C-based gas supply on the substrate surface is 10% or less and the in-plane distribution of the Si-based gas on the substrate surface is 10% or less, a non-mirror surface region was not generated in the high concentration layer. Thus, it has been found that, by setting the C/Si ratio to a preferable range in addition to the conditions under which the mirror surface is manufactured, the entire surface of the wafer can be a mirror surface, and the in-plane uniformity of the n-type doping concentration can be improved.

Figure 8:
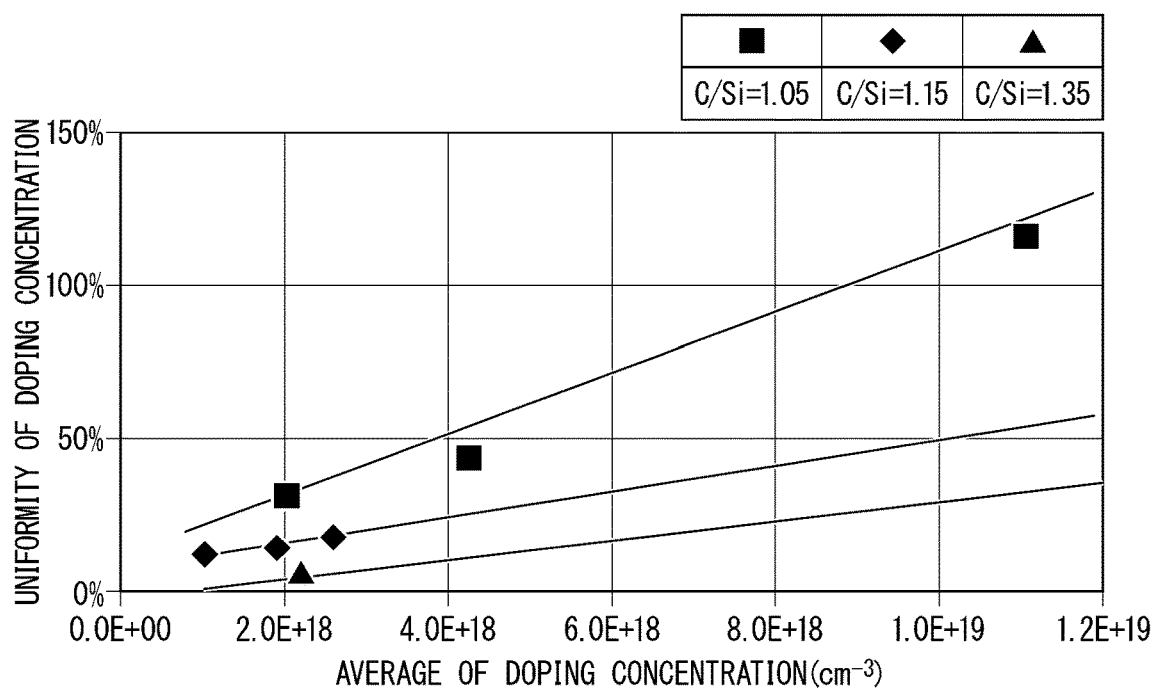
FIG. 8 is a graph showing a relationship between an average value of the doping concentration, in-plane uniformity of the doping concentration, and the C/Si ratio, which is shown in Table 1.

FIG. 8 is a graph showing, on the basis of the above experimental results and considerations, from the results shown in Table 1, a relationship between the average value of the n-type doping concentration, the in-plane uniformity of the n-type doping concentration, and the C/Si ratio for samples of the SiC epitaxial wafer having a diameter of 150 mm.

By estimating growth conditions of the C/Si ratio and the doping gas flow rate on the basis of the relationship shown in FIG. 8, for example, by estimating them in advance and making a prediction, the SiC epitaxial wafer including the high concentration layer having the average value of the n-type doping concentration of $1 \times 10^{18}$/cm$^3$ or more and $1 \times 10^{19}$/cm$^3$ or less, and the in-plane uniformity of the n-type doping concentration of 30% or less can be manufactured. For example, it can be seen from FIG. 8 that it is preferable to consider increasing the C/Si ratio because the uniformity of the doping concentration deteriorates as the film having a higher average doping concentration is desired.

Also, in FIG. 8, in the line shown in the graph in the case of the C/Si ratio of 1.35, the data on the line under the above conditions is one point, but it is considered to be a line obtained on the basis of a mechanism based on the site compensation effect described above. This will be described.

In FIG. 8, the graph in the case of the C/Si ratio of 1.05 and the graph in the case of the C/Si ratio of 1.15 are obtained from the data of three points. The fact that these graphs have positive slopes, and the slope of the graph in the case of the C/Si ratio of 1.15 is lower than the slope of the graph in the case of the C/Si ratio of 1.05 shows that the mechanism based on the site compensation effect fits well. It means that the higher the C/Si ratio, the better the in-plane uniformity of the doping concentration. That is, the higher the C/Si ratio, the lower the value of the in-plane uniformity of the doping concentration. Further, the fact that, in the SiC epitaxial layer in the vicinity of $2 \times 10^{18}$/cm$^3$, which is higher than the normal doping concentration, the in-plane uniformity of the doping concentration is more and more improved in the order of the C/Si ratio of 1.35, the C/Si ratio of 1.15, and the C/Si ratio of 1.05 also shows that the mechanism based on the site compensation effect fits well.

In view of the above, it can be inferred that, in the case of the C/Si ratio of 1.35, even within the doping concentration range of $1 \times 10^{18}$/cm$^3$ or more and $1 \times 10^{19}$/cm$^3$ or less, the mechanism based on the site compensation effect works well.

In a case in which the mechanism based on the site compensation effect fits well, it is inferred that the graph in the case of the C/Si ratio of 1.35 has a positive slope, and the slope is lower than the slope of the graph in the case of the C/Si ratio of 1.15.

As described above, the graph in the case of the C/Si ratio of 1.35 has been obtained on the basis of the mechanism based on the site compensation effect.

The present invention provides a SiC epitaxial wafer having high in-plane uniformity in doping concentration of a high concentration layer and a method for producing the same.

EXPLANATION OF REFERENCES

10 SiC single crystal substrate
10a Main surface of SiC single crystal substrate
20 SiC epitaxial layer
21 High concentration layer
22 Drift layer
30 Film forming device
32a Gas supply unit for supplying C-based gas
32b Gas supply unit for supplying Si-based gas
32c Gas supply unit for supplying carrier gas
32aa, 32ab, 32ac C-based gas supply pipe
32ba, 32bb Si-based gas supply pipe
100 SiC epitaxial wafer
P1 Point on calibration curve
R1, R3 Growth rate
C1, C2, C3 C Input amount of C-based gas

The invention claimed is:

1. A SiC epitaxial wafer comprising:
a SiC single crystal substrate; and
a high concentration layer that is provided on the SiC single crystal substrate and has an average value of an n-type doping concentration of $1 \times 10^{18}$/cm$^3$ or more and $1 \times 10^{19}$/cm$^3$ or less, and in-plane uniformity of the n-type doping concentration of 30% or less,
wherein the high concentration layer is doped with nitrogen, and
the in-plane uniformity is obtained from
an absolute value of (a maximum value of the n-type doping concentration−a minimum value of the n-type doping concentration)/an average value of the n-type doping concentration.

2. The SiC epitaxial wafer according claim 1,
wherein the high concentration layer is a buffer layer, and
a drift layer having an average value of a doping concentration lower than an average value of the doping concentration of the buffer layer is provided on the buffer layer.

3. The SiC epitaxial wafer according to claim 1, wherein the in-plane uniformity of the high concentration layer is 20% or less.

4. The SiC epitaxial wafer according to claim 1, wherein the in-plane uniformity of the high concentration layer is 10% or less.

5. The SiC epitaxial wafer according to claim 1, wherein a diameter of the wafer is 150 mm or more.

6. The SiC epitaxial wafer according to claim 2, wherein the in-plane uniformity of the high concentration layer is 20% or less.

7. The SiC epitaxial wafer according to claim 2, wherein the in-plane uniformity of the high concentration layer is 10% or less.

8. The SiC epitaxial wafer according to claim 3, wherein the in-plane uniformity of the high concentration layer is 10% or less.

9. The SiC epitaxial wafer according to claim 6, wherein the in-plane uniformity of the high concentration layer is 10% or less.

10. The SiC epitaxial wafer according to claim 2, wherein a diameter of the wafer is 150 mm or more.

11. The SiC epitaxial wafer according to claim 3, wherein a diameter of the wafer is 150 mm or more.

12. The SiC epitaxial wafer according to claim 4, wherein a diameter of the wafer is 150 mm or more.

13. The SiC epitaxial wafer according to claim 6, wherein a diameter of the wafer is 150 mm or more.

14. The SiC epitaxial wafer according to claim 7, wherein a diameter of the wafer is 150 mm or more.

15. The SiC epitaxial wafer according to claim 8, wherein a diameter of the wafer is 150 mm or more.

16. The SiC epitaxial wafer according to claim 9, wherein a diameter of the wafer is 150 mm or more.

17. The SiC epitaxial wafer according to claim 1, wherein the high concentration layer has the average value of the n-type doping concentration of $1.2 \times 10^{18}/cm^3$ or more and $1 \times 10^{19}/cm^3$ or less.

18. The SiC epitaxial wafer according to claim 1, wherein the high concentration layer has the average value of the n-type doping concentration of $1.5 \times 10^{18}/cm^3$ or more and $1 \times 10^{19}/cm^3$ or less.

19. The SiC epitaxial wafer according to claim 1, wherein the high concentration layer has the average value of the n-type doping concentration of $2 \times 10^{18}/cm^3$ or more and $1 \times 10^{19}/cm^3$ or less.

20. The SiC epitaxial wafer according to claim 1, wherein the high concentration layer has the average value of the n-type doping concentration of $3 \times 10^{18}/cm^3$ or more and $1 \times 10^{19}/cm^3$ or less.

21. The SiC epitaxial wafer according to claim 1, wherein the high concentration layer has the average value of the n-type doping concentration of $5 \times 10^{18}/cm^3$ or more and $1 \times 10^{19}/cm^3$ or less.

* * * * *